US006294311B1

(12) United States Patent
Shimazu et al.

(10) Patent No.: US 6,294,311 B1
(45) Date of Patent: Sep. 25, 2001

(54) LITHOGRAPHIC PRINTING PLATE HAVING HIGH CHEMICAL RESISTANCE

(75) Inventors: Ken-ichi Shimazu, Briarcliff Manor, NY (US); Jayanti Patel, Woodcliff Lake, NJ (US); Jianbing Huang, Woodridge, NJ (US); Nishith Merchant, North Bergon, NJ (US); Mathias Jarek, Northeim (DE)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 09/469,493

(22) Filed: Dec. 22, 1999

(51) Int. Cl.[7] .............................. G03F 7/004; G03F 7/11

(52) U.S. Cl. .................. 430/271.1; 430/166; 430/275.1; 430/302; 430/14; 525/203; 525/205; 525/217; 525/218; 525/221; 525/222; 525/238

(58) Field of Search ................................ 430/166, 271.1, 430/275.1, 302, 14; 525/203, 205, 218, 217, 221, 222, 238

(56) References Cited

U.S. PATENT DOCUMENTS

| | | | | |
|---|---|---|---|---|
| 5,141,838 | * | 8/1992 | Aoshima et al. | 430/191 |
| 5,705,308 | * | 1/1998 | West et al. | 430/165 |
| 5,705,322 | * | 1/1998 | West et al. | 430/190 |
| 5,731,127 | * | 3/1998 | Ishizuka et al. | 430/270.1 |
| 6,004,728 | * | 12/1999 | Deroover et al. | 430/302 |
| 6,022,667 | * | 2/2000 | Vermeersch et al. | 430/271.1 |
| 6,106,996 | * | 8/2000 | Van Damme et al. | 430/271.1 |
| 6,140,005 | * | 10/2000 | Van Damme et al. | 430/156 |

FOREIGN PATENT DOCUMENTS

| | | | | |
|---|---|---|---|---|
| 0864420 | * | 9/1998 | (EP) . | |
| 0903225 | | 3/1999 | (EP) | 430/270.1 |
| 0909657 | * | 4/1999 | (EP) . | |
| 0997272 | | 5/2000 | (EP) . | |
| 01056755 | | 3/1989 | (JP) . | |
| 01056756 | | 3/1989 | (JP) . | |
| 07149819 | | 6/1995 | (JP) . | |
| 9739894 | * | 10/1997 | (WO) . | |

* cited by examiner

*Primary Examiner*—John S. Chu
(74) *Attorney, Agent, or Firm*—Ratner & Prestia

(57) ABSTRACT

Imageable elements useful as lithographic printing members are disclosed. The elements contain a substrate, an underlayer, and a top layer. The underlayer contains a combination of polymeric materials that provides resistance both to fountain solution and to aggressive washes, such as a UV wash. The underlayer can be used in either thermally imageable or photochemically imageable elements.

52 Claims, No Drawings

LITHOGRAPHIC PRINTING PLATE HAVING HIGH CHEMICAL RESISTANCE

FIELD OF THE INVENTION

The invention relates to imageable elements useful in lithographic printing. More particularly, this invention relates to multilayer elements useful as lithographic printing members in which the underlayer comprises a combination of polymeric materials that provides resistance both to fountain solution and to aggressive washes.

BACKGROUND OF THE INVENTION

The art of lithographic printing is based on the immiscibility of oil and water. Ink receptive areas are generated on the surface of a hydrophilic surface. When the surface is moistened with water and then ink is applied, the hydrophilic background areas retain the water and repel the ink and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plates typically comprise a radiation-sensitive coating applied to a support. If after exposure to radiation, the exposed portions of the coating become soluble and are removed in the developing process, the plate is called as a positive-working printing plate. Conversely, if exposed portion of the plate become insoluble in the developer and the unexposed portions are removed by the developing process, the plate is called a negative-working plate. In each instance the portions of the radiation-sensitive layer (i.e., the image areas) that remain are ink-receptive.

Infrared-sensitive imaging elements for the preparation of positive-working lithographic printing plates have been disclosed comprising a substrate, an aqueous alkali soluble underlayer, and a radiation-sensitive top layer. On exposure, the exposed areas of the top layer become soluble or permeable in aqueous alkali so that the developer can penetrate the top layer and remove the underlayer, exposing the underlying substrate. Systems have been produced in which a developer insoluble top layer is coated over a developer soluble underlayer. Following exposure both layers are removed by the developer in the exposed region, revealing the hydrophilic surface of the underlying substrate.

In use, a lithographic printing member comes in contact with fountain solution. In addition, the printing member is often subjected to aggressive blanket washes, such as a "UV wash" to remove ultraviolet curable inks. However, many of these systems have limited resistance to either fountain solution and/or aggressive blanket washes. Thus, a need exists for an improved imageable element, useful as a lithographic printing member, that does not suffer from these disadvantages.

SUMMARY OF THE INVENTION

In one embodiment, the invention is a multilayer imageable element, useful as a precursor for a lithographic printing member, in which the underlayer is resistant both to fountain solution and to aggressive washes, such as a UV wash.

The element comprises:

a) a substrate, the substrate comprising a hydrophilic surface;

b) an underlayer over the hydrophilic surface; and c) a top layer over the underlayer:

wherein:

- the top layer is ink receptive;
- the underlayer is soluble in aqueous alkaline developer;
- the underlayer comprises a combination of at least a first polymeric material and a second polymeric material;
- the top layer comprises a third polymeric material; and
- the chemical resistance parameter for the underlayer is greater than about 0.4.

Depending primarily on the nature of the top layer, the element may be imaged photochemically or thermally. Although other layers, such as radiation absorbing layers may be present in the element, typically no other layers are present.

In another embodiment the invention is a composition useful as the underlayer for an imageable element. In another embodiment, the invention is an exposed and developed element, which can be used as a lithographic printing member. In another embodiment, the invention is a process for forming the lithographic printing member. In still another embodiment, the invention is a method of printing using the lithographic printing member.

DETAILED DESCRIPTION OF THE INVENTION

The invention is an imageable element useful as precursor for a lithographic printing plate. The element comprises a hydrophilic substrate, an underlayer, and a top layer. The underlayer comprises a unique combination of polymeric materials that surprisingly provides resistance both to fountain solution and to aggressive washes, such as a UV wash. Any top layer known in the art of lithographic printing may be used with the underlayer of the invention.

If the element is to be imaged by imagewise exposure with a beam of radiation, typically in the range of about 800 nm to about 1200 nm, the element absorbs imaging radiation. Either the top layer, the underlayer, or both may absorb the imaging radiation, and/or a separate imaging radiation absorbing layer may be present in the element. If the element is to be imaged photochemically or by exposure with a thermal head, it is unnecessary that the element absorb radiation in the range of 800 nm to 1200 nm.

Hydrophilic Substrate

The hydrophilic substrate, i.e., the substrate comprising at least one hydrophilic surface, comprises a support, which may be any material conventionally used to prepare lithographic printing plates. The support is preferably strong, stable and flexible. It should resist dimensional change under conditions of use so that color records will register in a full-color image. Typically, it can be any self-supporting material, including polymeric films, ceramics, metals, or stiff papers, or a lamination of any of these materials. Paper supports are typically "saturated " with polymerics to impart water resistance, dimensional stability and strength.

Metal supports include aluminum, zinc, titanium, and alloys thereof. A preferred metal support is an aluminum sheet. The surface of the aluminum sheet may be treated by techniques known in the art, including physical graining, electrochemical graining, chemical graining, and anodizing, and then conditioned by chemical means, for example by treatment with water, a solution of phosphate or silicate salt, or a polycarboxylic acid to produce the hydrophilic surface.

If the surface is roughened, the average roughness Ra is preferably in the range 0.1 $\mu$m to 0.8 $\mu$m. Roughened substrates in which the surface has a surface roughness of 0.1 μm to 2 μm are disclosed in Bhambra, WO097/19819 (PCT/GB96/02883); Bhambra, WO98/52769 (PCT/GB98/01500); and Bhambra, WO98/52768 (PCT/GB/98/01496). In these substrates the support is coated with a hydrophilic layer that comprises a mixture of two particulate materials, preferably alumina and titanium dioxide. The mean particle size of the alumina particles is preferably in the range of 1 μm to 5 μm; the mean particle size of the titanium dioxide particles is preferably in the range of 0.1 μm to 0.5 μm.

Useful polymeric films include polyester films (such as Mylar® polyethylene terephthalate film sold by E.I. du Pont de Nemours Co., Wilmington, Del. and polyethylene naphthanate). A preferred polymeric film is polyethylene terephthalate.

The substrate may consist only of the support, or it may additionally comprise one or more optional subbing and/or adhesion layers. Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion promoting materials, such as alkoxysilanes, aminopropyltriethoxysilane, glycidoxypropyltriethoxysilane and epoxy functional polymers, as well as conventional subbing materials used on polyester bases in photographic films.

The back side of the substrate (i.e., the side opposite the underlayer and top layer) may be coated with an antistatic agent and/or a slipping layer or matte layer to improve handling and "feel" of the imageable element.

The support should be of sufficient thickness to sustain the wear from printing and be thin enough to wrap around a printing form. Polyethylene terephthalate or polyethylene naphthanate, typically has a thickness of from about 100 to about 310 μm, preferably about 175 μm. Aluminum sheet typically has a thickness of from about 100 to about 600 μm.

Underlayer

The underlayer, or first layer, is over the hydrophilic surface of the substrate. It must be soluble or dispersible in the aqueous alkaline developer so that it is removed by the developer to expose the underlying hydrophilic surface of the substrate. Preferably the underlayer is soluble in the aqueous alkaline developer, rather than dispersible, to prevent sludging of the developer. Preferably it is soluble in a wholly aqueous developer, i.e., one that does not include added organic solvents. In addition it should be resistant to both fountain solution and to aggressive washes, such as a UV wash.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The one-minute soak loss in 80 wt % diacetone alcohol/20 wt % water tests resistance to a UV wash. The one-minute soak loss in 80 wt % 2-butoxyethanol (BUTYL CELLOSOLVE® solvent)/20 wt % water tests resistance to alcohol sub fountain solution. As described in the Examples, one-minute soak loss is measured by coating a layer of the polymeric material on a substrate, typically at a coating weight of about 1.5 g/m$^2$, soaking the coated substrate in the appropriate solvent at room temperature for one minute, drying the coated substrate, and measuring the weight loss as a percent of the total weight of the polymeric material present on the substrate.

The chemical resistance parameter should be greater than about 0.4, preferably greater than about 0.5, more preferably greater than about 0.6. In favorable cases a chemical resistance parameter of at least about 0.65 or greater can be obtained. The one-minute soak loss in each solvent should be less than about 60%, preferably less than about 40%, and more preferably less than about 35%. Preferably the minute soak loss in one solvent is less than about 40%, more preferably less than about 30%; and more preferably less than about 20%, and most preferably less than about 10%. More preferably, the one-minute soak loss in the other solvent should be less than about 60%, preferably less than about 40%, and more preferably less than about 35%.

Underlayers that comprise a single polymeric material may meet these requirements. Chemical resistance can be improved by use of a combination of two or more polymeric material.

A combination of a first polymeric material that is resistant to 80 wt % diacetone alcohol/20 wt % water with a second polymeric material that is resistant to 80 wt % 2-butoxyethanol/20 wt % water surprisingly produces a layer that shows good resistance to both solvents. Preferably, the first polymeric material has a one-minute soak loss of less than about 20%, more preferably less than about 10%, and most preferably less than about 5% in 80 wt % diacetone alcohol/20 wt % water, and the second polymeric material has a one-minute soak loss of less than about 20%, more preferably less than about 10%, and most preferably less than about 5%, in 80 wt % 2-butoxyethanol/20 wt % water.

Useful first polymeric materials are copolymers that are soluble in aqueous alkaline developer and are resistant to 80 wt % diacetone alcohol/20 wt % water. Preferably they contain at least one functional group selected from the group consisting of: carboxylic acids, especially those derived from polymerization of acrylic acid or methacrylic acid; N-substituted cyclic imides, such as maleimide derived from N-phenyl maleimides; and amides, especially those derived from acrylamide and methacrylamide. More preferably two of the functional groups are present in the copolymer, and most preferably all three functional groups are present in the copolymer.

Particularly useful first polymeric materials are copolymers that comprise N-substituted maleimides, especially N-phenylmaleimide; methacrylamides, especially methacrylamide; and acrylic and/or methacrylic acid, especially methacrylic acid. Other hydrophilic monomers, such as hydroxyethyl methacrylate, may be used in place of some of all of the methacrylamide. Other alkaline developer soluble monomers, such as acrylic acid, may be used in place of some or all of the methacrylic acid.

The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid.

Useful second polymeric materials are copolymers that soluble in aqueous alkaline developer and are resistant to 80 wt % 2-butoxyethanol/20 wt % water. Preferably they contain at least one functional group selected from the group consisting of: nitrile, especially those derived from polymerization of acrylonitrile or methacrylonitrile; and sulfonamide.

Particularly useful second polymeric materials, which are resistant to 80 wt % 2-butoxyethanol/20 wt % water, are aqueous alkaline developer soluble copolymers that comprise a monomer that has a urea bond in its side chain (i.e., a pendent urea group), such are disclosed in Ishizuka, U.S. Pat. No. 5,731,127, incorporated herein by reference. These copolymers comprise about 10 to 80 wt %, preferably about 20 to 80 wt %, of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

R is preferably $CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH.

A preferred monomer is:

$$[CH_2{=}C(CH_3){-}CO_2{-}CH_2CH_2{-}NH{-}CO{-}NH{-}p{-}C_6H_4{-}Z],$$

in which Z is —OH, —COOH, or —$SO_2NH_2$, preferably —OH.

In the synthesis of the copolymer, one or more of the urea group containing monomers may be used. The copolymers also comprise 20 to 90 wt % other polymerizable monomers, such as N-substituted maleimides, acrylic acid, methacrylic acid, acrylic esters, methacrylic esters, acrylonitrile, methacrylonitrile, acrylamides, and methacrylamides.

A copolymer that comprises in excess of 60 mol % and not more than 90 mol % of acrylonitrile and/or methacrylonitrile in addition to acrylamide and/or methacrylamide provides superior physical properties. More preferably the alkaline developer soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide.

Another group of particularly useful second polymeric materials, which are resistant to 80 wt % 2-butoxyethanol/20 wt % water, include aqueous alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838, incorporated herein by reference. Particularly useful polymeric materials comprise (1) the sulfonamide monomer unit, especially N-(p-aminosulfonylphenyl) methacrylamide amide; (2) acrylonitrile and/or methacrylonitrile; and (3) methyl methacrylate and/or methyl acrylate. Certain of these copolymers are available as the "PU Copolymers" from Kokusan Chemical, Gumma, Japan.

The polymeric materials described above are soluble in aqueous alkaline developer. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

These polymeric materials can be prepared by methods, such as free radical polymerization, well known to those skilled in the art. Synthesis of the alkaline developer soluble copolymers that have urea bonds in their side chains is disclosed, for example, in Ishizuka, U.S. Pat. No. 5,731,127.

The underlayer may also comprise one or more other polymeric materials, provided addition of these polymeric materials does not adversely affect the chemical resistance and solubility properties of the underlayer. Preferred other polymeric materials, when present, are novolac resins, which may be added to improve the run length of the printing member by a post-development bake process.

The underlayer may absorb radiation, preferably radiation in the range of about 800 nm to 1200 nm, the range of radiation commonly used for imaging thermally imageable-elements. An absorber, sometimes referred to as "a photothermal conversion material" may be present in the underlayer. Photothermal conversion materials absorb radiation and convert it to heat. Photothermal conversion materials may absorb ultraviolet, visible, and/or infrared radiation and convert it to heat. Although one of the polymeric materials may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrilium or metal diothioline class. Examples of absorbing pigments are Projet 900, Projet 860 and Projet 830 (all available from the Zeneca Corporation). Carbon black pigments may also be used. Because of their wide absorption bands, carbon black-based plates can be used with multiple infrared imaging devices having a wide range of peak emission wavelengths.

Dyes, especially dyes that are soluble in the aqueous alkaline developer, are preferred to prevent sludging of the developer by insoluble material. The dye may be chosen, for example, from indoaniline dyes, oxonol dyes, porphyrin derivatives, anthraquinone dyes, merostyryl dyes, pyrylium compounds and sqarylium derivatives. Radiation absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618, all of which are incorporated herein by reference. Examples of useful absorbing dyes include, ADS-830A and ADS-1064 (both available from American Dye Source, Montreal, Canada), EC2117 (available from FEW, Wolfen, Germany), Cyasorb IR 99 and Cyasorb IR 165 (both available from Glendale Protective Technology), Epolite IV-62B and Epolite III-178 (both available from the Epoline), PINA-780 (available from the Allied Signal Corporation), SpectraIR 830A and SpectraIR 840A (both available from Spectra Colors).

When present, the amount of absorber in the underlayer is generally sufficient to provide an optical density of at least 0.05, and preferably, an optical density of from about 0.5 to about 2 at the imaging wavelength. As is well known to those skilled in the art, the amount of absorber required to produce a particular optical density can be determined from the thickness of the underlayer and the extinction coefficient of the absorber at the wavelength used for imaging using Beers law. For thermally imageable elements that are to be imaged by radiation, elements in which the underlayer absorbs the imaging radiation are preferred.

The underlayer typically comprises about 10% to about 90% by weight of the first polymeric material and about 10% to about 90% by weight of the second polymeric material, based on the total weight the first and second polymeric materials in the underlayer. Preferably the underlayer comprises about 40% to about 85% by weight of the first polymeric material and about 15% to about 60% of the second polymeric material, based on the total weight the first and second polymeric materials in the underlayer. The first and second polymeric materials together typically comprise at least about 50 wt %, preferably at least about 60 wt %, and more preferably at least about 65 wt %, of the underlayer, based on total weight of the materials in the underlayer. When present, typically up to about 20 wt %, preferably about 1 to about 20 wt %, of other polymeric materials may be present in the underlayer, based on the total amount of all the polymeric materials in the underlayer. When the underlayer has been formulated to absorb imaging radiation, typically the underlayer comprises at least about 0.1 wt % of absorber, and preferably from about 1 to about 30 wt % of absorber, based on the total weight of the underlayer.

The combinations of these polymeric materials are soluble in aqueous alkaline developer. In addition they are typically soluble in polar solvent and solvent mixtures such as methyl lactate/methanol/dioxolane (15:42.5:42.5 wt %) mixture, which can be used as the coating solvent for the underlayer. However, they are poorly soluble in less polar solvents and solvent mixtures such as acetone, which can be used as solvents to coat the top layer on over underlayer without dissolving the underlayer.

Top Layer

The top layer, or second layer, protects the underlying aqueous alkaline developer soluble underlayer from the aqueous alkaline developer. Any of the top layers known in the art of lithographic printing can be used with the underlayers of this invention. The top layer is ink receptive and comprises a third polymeric material.

Thermally Imageable Elements

In one embodiment, the third polymeric material is ink-receptive and insoluble in the aqueous solution having a pH of about 7 or greater, and soluble or dispersible in a solvent such as an organic solvent or an aprotic solvent. Useful polymeric materials of this type include acrylic polymers and copolymers; polystyrene; styrene-acrylic copolymers; polyesters, polyamides; polyureas; polyurethanes; nitrocellulosics; epoxy resins; and combinations thereof. Preferred are polymethyl methacrylate and polystyrene. Although these polymeric materials are not soluble in the aqueous alkaline developer, when portions of the imageable element are thermally exposed, they selectively become permeable to the developer and are removed thereby.

Systems in which the underlayer absorbs imaging radiation are disclosed in U.S. appln. Ser. No. 09/301,866 [PCT/US99/12689], incorporated herein by reference. Systems in which the top layer absorbs imaging radiation are disclosed in European Patent Publication EP 0 864 420.

In another embodiment, the third polymeric material is ink-receptive and dissolves in an aqueous alkaline developer, but the top layer is insoluble in aqueous alkaline developer prior to imaging. However, the top layer becomes soluble in aqueous alkaline developer following imaging. Third polymeric materials that are water insoluble, but dissolve in aqueous alkaline developers, are used to prevent sludging of the developer.

Polymers that contain phenolic hydroxyl groups, i.e., phenolic resins, are preferred. Preferably the polymeric material is a light-stable, water-insoluble, aqueous alkaline developer-soluble, film-forming polymeric material that has a multiplicity of phenolic hydroxyl groups, either on the polymer backbone or on pendant groups. Phenolic groups impart aqueous alkaline developer solubility to the top layer and are also believed to form a thermally frangible complex with the solubility-suppressing component. Novolac resins, resol resins, acrylic resins that contain pendent phenol groups, and polyvinyl phenol resins are preferred phenolic resins. Novolac resins are more preferred.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conditions well known to those skilled in the art.

Other useful phenolic resins include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

In this embodiment, the top layer preferably comprises a compound that functions as a solubility-suppressing component for the polymeric material, which is soluble in the aqueous developer. Though not being bound by any theory or explanation, solubility-suppressing components are believed to be "reversible insolubilizers," i.e., compounds that reversibly suppress the solubility of the polymeric material in the developer. Solubility-suppressing components have polar functional groups that are believed to act acceptor sites for hydrogen bonding with the phenolic hydroxyl groups present in the third polymeric material. The acceptor sites comprise atoms with high electron density, preferably selected from electronegative first row elements, especially carbon, nitrogen, and oxygen. Solubility-suppressing components that are soluble in the aqueous alkaline developer are preferred.

The solubility-suppressing component may be a separate dissolution inhibitor compound. Alternatively, or additionally, the third polymeric material may contain polar groups in addition to phenolic groups and, thus, function as both the polymeric material and the solubility-suppressing component. Useful dissolution inhibitor compounds are disclosed in West, U.S. Pat. No. 5,705,308; Parsons, WO 97/39894 and U.S. appln. Ser. No. 08/981,620; Bennett, WO97/07986 [PCT/GB96/01973]; Nagasaka, EP 0 823 327, and U.S. pat. appln. Ser. No. 08/752,698, filed Feb. 21, 1997, allowed Apr. 12, 1999; Miyake, EP 0 909 627; West, WO 98/42507 and U.S. appln. Ser. No. 08/821,844; Nguyen, WO 99/11458 and U.S. appln. Ser. No. 08/922,190, all of which are incorporated herein by reference.

Solubility-suppressing components are believed to reversibly reduce the rate at which the polymeric material dissolves in an aqueous alkaline developer. While not being bound by any theory or explanation, it is believed that a thermally frangible complex is formed between the solubility-suppressing component and the polymeric material. When the element is heated, typically by imagewise exposure to imaging radiation in the range of about 800 nm to about 1200 nm or by a thermal head, the thermally frangible complex breaks down. The developer penetrates the exposed regions of the top layer much more rapidly than it penetrates the unexposed regions. The underlying regions of the underlayer are removed along with the exposed regions of the top layer, revealing the underlying hydrophilic surface of the substrate.

In general, such compounds should have an "inhibition factor" of at least 0.5, and preferably at least 5. Inhibition factors for given compounds can be readily measured using the procedure described by Shih et al, *Macromolecules*, 27, 3330 (1994). The inhibition factor is the slope of the line obtained by plotting the log of the development rate as a function of inhibitor concentration in the coating. Development rates are conveniently measured by laser interferometry, as described by Meyerhofer, *IEEE Trans. Electron Devices*, ED-27, 921 (1980).

Useful polar groups include, for example, diazo groups; diazonium groups; keto groups; sulfonic acid ester groups; phosphate esters groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as solubility-suppressing components. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoesters or β-ketoamides may also be useful as solubility-suppressing components. Compounds that contain aromatic groups, such as phenyl, substituted phenyl such as p-methylphenyl, and naphthyl, are especially useful.

Compounds that contain a diazo group that are useful as dissolution inhibitor compounds include, for example, o-diazonaphthoquinones (i.e., quinonediazides), such as compounds in which the o-diazonaphthoquinone moiety is attached to a ballasting moiety that has a molecular weight of less than about 5000. Typically these compounds are prepared by the reaction of a 1,2-naphthoquinone diazide having a halogenosulfonyl group, typically a sulfonylchloride group, at the 4- or 5-position with a mono- or polyhydroxyphenyl compound, such as a mono- or poly-hydroxy benzophenone. Preferred reactive compounds are the sulfonyl chloride or esters; the sulfonyl chlorides are most preferred. These compounds are discussed, for example, in Chapter 5 of *Photoreactive Polymers: the Science and Technology of Resists*, A. Reiser, Wiley, N.Y., 1989, pp. 178–225.

Useful compounds include, but are not limited to: 2,4-bis(2-diazo-1,2-dihydro-1-oxo-5-naphthalenesulfonyloxy)benzophenone; 2-di-azo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis(2-diazo-1,2-dihydro-1-oxo-5-naphthalenesulfonyloxy)biphenyl; 2,2', 4,4'-tetrakis(2-diazo-1,2-dihydro-1-oxo-5-naphthalenesulfonyloxy)biphenyl; 2,3,4-tris(2-diazo-1,2-dihydro-1-oxo-5-naphthalenesulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo- 1,2-dihydro-1-oxo-4-naphthalenesulfonyloxy)biphenyl; 2,2', 4,4'-tetrakis(2-diazo-1,2-dihydro-1-oxo-4-naphthalenesulfonyloxy)-biphenyl; 2,3,4-tris(2-diazo-1,2-dihydro-1-oxo-4-naphthalenesulfonyloxy)benzophenone; and others known in the art, for example, those described in Mizutani, U.S. Pat No. 5,143,816.

Polymeric o-diazonaphthoquinone compounds include derivitized resins formed by the reaction of a reactive derivative that contains an o-diazonaphthoquinone moiety and a polymeric material that contains a suitable reactive group, such as a hydroxyl or amino group. Suitable polymeric materials for forming these derivitized resins include the novolac resins, resole resins, polyvinyl phenols, acrylate and methacrylate copolymers of hydroxy-containing monomers such as vinyl phenol and 2-hydroxyethyl methacrylate, polyvinyl alcohol, etc. Representative reactive derivatives include sulfonic and carboxylic acid, ester or amide derivatives of the o-diazonaphthoquinone moiety. Derivitization of phenolic resins with compounds that contain the o-diazonaphthoquinone moiety is well known in the art and is described, for example, in West, U.S. Pat. Nos. 5,705,308, and 5,705,322. An example of a resin derivitized with a compound that comprises a diazonaphthoquinone moiety is P-3000, naphthoquinone diazide of a pyrogallol/acetone resin (available from PCAS, France).

Compounds that contain a positively charged (i.e., quaternized) nitrogen atom useful as dissolution inhibitor compounds include, for example, tetraalkyl ammonium compounds, quinolinium compounds, benzothiazolium compounds, pyridinium compounds, and imidazole compounds. Representative tetraalkyl ammonium dissolution inhibitor compounds include tetrapropyl ammonium bromide; tetraethyl ammonium bromide; tetrapropyl ammonium chloride; and trimethylalky ammonium chlorides and trimethylalky ammonium bromides, such as trimethyloctyl ammonium bromide and trimethyldecyl ammonium chloride. Representative triarylmethane dyes dissolution inhibitor compounds include ethyl violet, crystal violet, malachite green, brilliant green, Victoria blue B, Victoria blue R, and Victoria pure blue BO.

Quaternized heterocyclic compounds are useful as dissolution inhibitors. Representative imidazoline compounds include Monazoline C, Monazoline O, Monazoline CY, and Monazoline T, all of which are manufactured by Mona Industries. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl)benzo-thiazolium cationic dyes and 3-ethyl-2-methyl benzothiazolium iodide. Suitable pyridinium dissolution inhibitor compounds include cetyl pyridinium bromide and ethyl viologen dications.

Diazonium salts are useful as dissolution inhibitor compounds and include, for example, substituted and unsubstituted diphenylamine diazonium salts, such as methoxysubstituted diphenylamine diazonium hexafluoroborates. These compounds are particularly useful in non-preheat plates.

Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenyl amine and triphenyl amine.

Keto containing compounds useful as dissolution inhibitor compounds include, for example, aldehydes; ketones, especially aromatic ketones; and carboxylic acid esters. Representative aromatic ketones include xanthone, flavanone, flavone, 2,3-diphenyl-1-indenone, 1'-(2'-acetonaphthonyl)benzoate, α- and β-naphthoflavone, 2,6-diphenyl-4H-pyran-4-one and 2,6-diphenyl-4H-thiopyran-4-one. Representative carboxylic acid esters include ethyl benzoate, n-heptyl benzoate, phenyl benzoate.

A preferred group of dissolution inhibitor compounds are those that are also dyes, especially triarylmethane dyes such as ethyl violet. These compounds can also act as contrast dyes, which distinguishes the unimaged regions from the imaged regions in the developed imageable element.

When a dissolution inhibitor compound is present in the top layer, its amount can vary widely, but generally it is at least about 0.1 wt %, typically 0.5 wt % to 30 wt %, preferably about 1 wt % to 15 wt %, based on the total dry composition weight of the layer.

Alternatively, or additionally, the polymeric material can comprise polar groups that act as acceptor sites for hydrogen bonding with the hydroxy groups present in the polymeric material and, thus, act as a solubility-suppressing component. Using methods well know to those skilled in the art, a portion of the polymeric material hydroxyl groups can be derivitized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

Derivitization of the hydroxyl groups of the polymeric material increases its molecular weight and reduces the number of hydroxyl groups, typically reducing both the solubility and the rate of dissolution of the polymeric material in the developer. Although is important that the level of derivitization be high enough that the polymeric material acts as a solubility-suppressing component, it should not be so high that, following thermal imaging, the polymeric material is not soluble in the developer. Although the degree of derivitization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivitized. These derivitized polymeric materials can act as both the third polymeric material and a solubility-suppressing component. They can be used alone in the top layer, or they can be combined with other polymeric materials and/or solubility-suppressing components.

One preferred group of polymeric materials that comprise polar groups and function as solubility-suppressing components are derivitized phenolic polymeric materials in which a portion of the phenolic hydroxyl groups have been converted to sulfonic acid esters, preferably phenyl sulfonates or p-toluene sulfonates. Derivitization can be carried by reaction of the polymeric material with, for example, a sulfonyl chloride such as p-toluene sulfonyl chloride in the presence of a base such as a tertiary amine. A preferred polymeric material is a derivitized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

It will be appreciated by those skilled in the art that although phenolic polymers which have been derivitized with polar groups [e.g., polymers in which some of the hydroxyl groups have been derivitized with sulfonic acid ester groups or with groups that contain the diazonaphthoquinone moiety] are soluble in aqueous alkaline developer, a layer comprising or consisting essentially of one or more of these materials is "insoluble" in aqueous alkaline developer. This is because solubility and insolubility of the layer are determined by the relative rates at which the imaged and unimged regions of the layer dissolve in the developer. Following imagewise thermal exposure of a layer comprising or consisting essentially of one or more of these derivitized phenolic polymeric materials, the exposed regions of the layer dissolve in the aqueous alkaline developer more rapidly than the unexposed regions. If the development step is carried out for an appropriate time, the exposed regions are removed and the unexposed regions remain, so that an image made up of the unexposed regions is formed. Hence the exposed regions are "soluble" in the aqueous developer and the unexposed regions are "insoluble" in the aqueous alkaline developer.

The solubility-suppressing components are believed not to be sensitive, i.e. photoreactive, themselves to radiation in the range of about 600 nm to about 800 nm and radiation in the range of about 800 nm to about 1200 nm, the range typically used for imaging a thermally imageable element. If radiation is to be used for imaging and it is to be absorbed in the underlayer (i.e., the underlayer comprises an imaging radiation absorber), the solubility-suppressing component preferably should not absorb a significant amount of the imaging radiation. The imaging radiation should pass through the top layer so that it can be absorbed by the absorber in the underlying underlayer. Thus, unless absorption of imaging radiation by the top layer is desired, when a dye is used as the solubility-suppressing component, it should not absorb a significantly at the imaging wavelength if the element is to imaged by radiation and the radiation is to be absorbed in the underlayer. Preferably, the imaging radiation absorber absorbs more strongly in the range of about 800 nm to about 1200 nm than it does in the visible (i.e., about 380 nm to about 780 nm).

The top layer may also comprise a dye to aid in the visual inspection of the exposed and/or developed element. Printout dyes to distinguish the exposed regions from the unexposed regions during processing. Contrast dyes distinguish the unimaged regions from the imaged regions in the developed plate. If the element is to be imaged by imaging radiation and the imaging radiation is to be absorbed in the underlayer, the dye should not absorb strongly at the imaging wavelength.

The top layer may radiation, preferably radiation in the range of about 800 nm to 1200 nm, the range of radiation commonly used for imaging thermally imageable elements. An absorber, sometimes referred to as "a photothermal conversion material" may be present in the top layer. Photothermal conversion materials absorb radiation and convert it to heat. Photothermal conversion materials may absorb ultraviolet, visible, and/or infrared radiation and convert it to heat. Although the polymeric material may itself comprise an absorbing moiety, i.e., be a photothermal conversion material, typically the photothermal conversion material is a separate compound. Materials useful as photothermal conversion materials are discussed above.

Photochemically Imageable Elements

The top layer of a photochemically imageable element comprises a positive working photoimagable composition. The photoimageable composition comprises a phenolic resin and a material that comprises a o-diazonaphthoquinone (naphthoquinonediazide) moiety, i.e., a o-diazonaphthoquinone compound and/or a phenolic resin derivitized with a o-diazonaphthoquinone moiety, or a mixture of these materials. Photo-imageable compositions comprising materials that comprises a o-diazonaphthoquinone (diazonaphthoquinone) moiety are described in numerous patent and publications, such as Schmidt, U.S. Pat. Nos. 3,046,110, 3,046,111, 3,046,115, 3,046, 118, and 3,046,120; Süs, U.S. Pat. Nos. 3,046,119, and 3,046,122; and Rauner, U.S. Pat. No. 3,647,443; as well as in Chapter 5 of *Photoreactive Polymers: the Science and Technology of Resists*, A. Reiser, Wiley, N.Y., 1989, pp. 178–225. While not being bound by any theory or explanation, it is believed that image discrimination in these systems is based on a kinetic effect. The exposed regions dissolve more rapidly in the basic developer than the unexposed regions. Development is carried out for a long enough time to dissolve the exposed regions in the developer, but not long enough to dissolve the unexposed regions. Hence the exposed regions are described as being "soluble" in the developer and the unexposed regions as being "insoluble" in the developer.

Useful materials containing the o-diazonaphthoquinone moiety, i.e., o-diazonaphthoquinone compounds and phenolic resin derivitized with a o-diazonaphthoquinone moiety, include, are not limited to, those discussed above.

The top layer also comprises a phenolic resin. Useful phenolic resins are described above. Novolac resins are preferred.

The top layer comprises a material that comprises a o-diazonaphthoquinone (naphthoquinonediazide) moiety, i.e., a o-diazonaphthoquinone compound and/or a phenolic resin derivitized with a o-diazonaphthoquinone moiety, or a mixture of these materials. The amount of the o-diazonaphthoquinone moiety present in the layer, which may be present in a o-diazonaphthoquinone compound and/or in a resin derivitized with a o-diazonaphthoquinone moiety, is typically at least about 1 wt %, and more typically 1 to 30 wt %.

The top layer may also comprise dye to aid in the visual inspection of the exposed and/or developed element. Printout dyes to distinguish the exposed regions from the unexposed regions during processing. A compound that generates acid on exposure to actinic radiation, such as a halogen-containing triazine, may also be present to produce a print-out image. Contrast dyes distinguish the unimaged regions from the imaged regions in the developed plate.

Preparation of the Imageable Element

The imageable element may be prepared by sequentially applying the underlayer over the hydrophilic surface of the hydrophilic substrate, and then applying the top layer over the underlayer using conventional coating or lamination methods. However, it is important to avoid intermixing the underlayer and top layer.

The underlayer, or first layer, may be applied over the hydrophilic substrate by any conventional method. Typically the ingredients are dispersed or dissolved in a suitable coating solvent, and the resulting mixtures coated by conventional methods, such as spin coating, bar coating, gravure coating, or roller coating. The top layer, or second layer, may be applied over the underlayer, typically to the surface of the underlayer by any conventional method, such as those listed above. The term "solvent" includes mixtures of solvents, especially mixtures of organic solvents.

Selection of the solvents used to coat the underlayer and to coat the top layer will depend on the nature of the polymeric materials and the other ingredients present in the layers. To prevent the underlayer from dissolving and mixing with the top layer when the top layer is coated over the underlayer, the top layer should be coated from a solvent in which the first and second polymeric materials are essentially insoluble. Thus, the coating solvent for the top layer should be a solvent in which the third polymeric material is sufficiently soluble that the top layer can be formed and in which the first and second polymeric materials are essentially insoluble. Typically the first and second polymeric materials will be soluble in more polar solvents and insoluble in less polar solvents so that the solvent used to coat the underlayer is more polar than the solvent used to coat the top layer. Consequently, the top layer can typically be coated from a conventional organic solvent such as toluene or 2-butanone. An intermediate drying step, i.e., drying the underlayer to remove coating solvent before coating the top layer over it, may also be used to prevent mixing of the layers.

The top layer may be coated as an aqueous dispersion to avoid dissolving the underlayer during the coating process. Alternatively, the underlayer, the top layer or both layers may be applied by conventional extrusion coating methods from a melt mixture of layer components. Typically, such a melt mixture contains no volatile organic solvents.

Imaging

Imaging is carried out by methods well known to those skilled in the art, such as exposure with ultraviolet radiation, visible radiation, near infrared radiation, or infrared radiation, or by a thermal head. In general, the method of imaging used depends primarily on the nature of the top layer. However, for imaging with radiation in the near infrared or infrared range, an element that absorbs in the appropriate wavelength is preferred.

A thermally imageable element may be imaged with a laser or an array of lasers emitting modulated near infrared or infrared radiation in a wavelength region that is absorbed by the element. Infrared radiation, typically infrared radiation in the range of about 800 nm to about 1200 nm, may be used for imaging a thermally imageable element. Imaging is conveniently carried out with a laser emitting at about 830 nm or at about 1056 nm. Suitable commercially available imaging devices include image setters such as a Creo Trendsetter (available from the CREO Corp., British Columbia, Canada) and a Gerber Crescent 42T (available from the Gerber Corporation).

Alternatively, a thermally imageable element may be imaged using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure is carried out with a thermal head, it is unnecessary that the element absorb infrared radiation. However, elements that absorb infrared radiation can be imaged with a thermal head.

In either case, imaging is typically carried out by direct digital imaging. The image signals are stored as a bitmap data file on a computer. Such files may be generated by a raster image processor (RIP) or other suitable means. For example, a RIP can accept input data in page-description language, which defines all of the features required to be transferred onto the imageable element, or as a combination of page-description language and one or more image data files. The bitmaps are constructed to define the hue of the color as well as screen frequencies and angles.

For photochemical imaging, the element is imagewise exposed to actinic radiation from a source of light that is absorbed by the photoreactive component or components of the top layer, such as a carbon arc lamp, a mercury lamp, a xenon lamp, a tungsten lamp, a metal halide lamp, or a laser emitting at the appropriate wavelength. o-Diazonaphthoquinones substituted in the 5-position typically absorb at 350 nm and 400 nm. Diazonaphthoquinones substituted in the 4-position typically absorb at 310 nm and 390 nm. Imagewise exposure is typically carried out through a photomask, but direct digital exposure with a laser emitting at the appropriate wavelength is also possible.

Imaging of the imageable element produces an imaged element, which comprise a latent image of imaged and unimaged regions. Developing the exposed element to form a developed element, converts the latent image to an image by removing the exposed regions of the top layer and the underlayer, and exposing the hydrophilic surface of the underlying substrate.

The imageable element is "positive working," in that the first and top layers are removed in the exposed regions to expose the underlying hydrophilic surface of the hydrophilic substrate. Thus, the exposed regions become the non-ink accepting regions.

The exposed element is developed in an appropriate developer. The developer may be any liquid or solution that can penetrate and dissolve both the exposed regions of the top layer and the underlying regions of the underlayer without substantially affecting the complimentary unexposed regions.

Useful developers are the aqueous solutions having a pH of about 7 or above. Preferred developers are those that have a pH between about 8 and about 13.5, typically at least about 11, preferably at least about 12. Wholly aqueous developers, i.e., those that do not comprise an added organic solvent, are preferred. Useful aqueous alkaline developers include commercially available developers, such as PC3000, PC955, and PC9000, aqueous alkaline developers each available from Kodak Polychrome Graphics LLC.

Typically an aqueous alkaline developer is applied to the imaged element by rubbing or wiping the top layer with an applicator containing the developer. Alternatively, the imaged element may be brushed with the developer or the developer may be applied to the element by spraying the top layer with sufficient force to remove the exposed regions. In either instance, a developed element is produced.

The developed element, typically a lithographic printing member or printing plate, comprises (1) regions in which the underlayer and top layer have been removed revealing the underlying surface of the hydrophilic substrate, and (2) complimentary regions in which the under layer and top layer have not been removed. The regions in which both the underlayer and top layer have not been removed are ink receptive and correspond to the regions that were not exposed during imaging.

If desired, a post-development baking step can be used to increase the run length of the printing member. Baking can be carried out, for example, at about 220°C. to about 240°C. for about 7 to 10 minutes.

The advantageous properties of the invention can be observed by reference to the following examples that illustrate, but do not limit, the invention.

EXAMPLES

Glossary

28–2930 Vinyl acetate/crotonates/vinyl neodecanoate copolymer (National Starch and Chemical Co.)

1077 Alkyl substituted novolac resin (Schenectady Int., Schenectady, N.Y., USA)

A-21 30% solution of polymethyl methacrylate in 90:10 toluene/butanol (Rohm & Haas)

ADS-830A Infrared absorbing dye ($\lambda_{max}$=830 nm) (American Dye Source, Montreal, Canada)

Copolymer 1 Copolymer of N-phenylmaleimide, methacrylamide, and methacrylic acid (40:35:25 mol %)

Ethyl Violet C.I. 42600; CAS 2390-59-2 ($\lambda_{max}$=596 nm) $[(p\text{-}(CH_3CH_2)_2NC_6H_4)_3C^+Cl^-]$ HRS02 Alkyl substituted novolac resin LB 744 Cresol novolac resin (Bakelite, Iserlohn-Letmathe, Germany)

PMP234 Copolymer (40:50:10 wt %) of APK-234, acrylonitrile, and methacrylamide. APK-234 is a urea substituted monomer of the following structure: $[CH_2{=}C(CH_3){-}CO_2{-}CH_2CH_2{-}NH{-}CO{-}NH{-}p{-}C_6H_4{-}OH]$ P-3000 Naphthoquinone diazide of a pyrogallol/acetone resin (PCAS, France)

PU Copolymer Copolymer of N-(p-aminosulfonylphenyl)-methacrylamide, acrylonitrile, and methyl methacrylate (34/24/42 mol % =60.5/9.3/30.2 wt %) (Kokusan Chemical, Gumma, Japan)

Scriptset 540 Ethyl half ester of a maleic anhydride/styrene copolymer (Monsanto, St. Louis, Mo.)

SD-140A Novolac resin (Borden Chemical, Columbus, Ohio, USA)

Triazine B 2,4-Bis(trichloromethyl)-6-(4-methoxy-1-naphthyl)-1,3,5-triazine (PCAS, France)

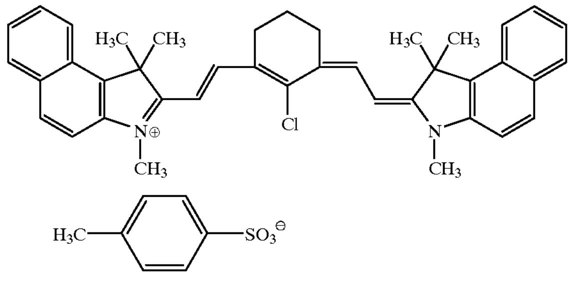

EC2117

Comparative Example 1

This example illustrates the solvent resistance of an underlayer of PU copolymer. PU copolymer (5 g) and ADS-830A dye (0.9 g) were dissolved in 100 g of a methanol/dioxolane/-methyl lactate mixture (43:43:14 wt %). The mixture was spin coated onto a standard lithographic substrate at a coating weight of 1.5 g/m$^2$. The substrate was an aluminum sheet that had been electrochemically grained, anodized, and coated with polyvinyl phosphonic acid.

Solvent resistance of the underlayer was measured in terms of soak loss in two different solvent mixtures. The soak loss was measured by measuring the weight change of a 1 dm$^2$ plate before soaking and after soaking for a specific time at room temperature and drying. Soak loss was calculated by dividing the weight loss by the total weight of the coating.

The one-minute soak loss in 80 wt % diacetone alcohol/20 wt % water, formulated to test resistance to UV wash, was about 100%. The one-minute soak loss in 80 wt % 2-butoxyethanol/20 wt % water, formulated to test resistance to alcohol sub fountain solution, was about 0%. This suggests that the layer is resistant to fountain solution but not to UV wash.

A coating solution for the top layer was prepared by dissolving 12.47 g of A-21 in 190 g of toluene. PMP-1100 poly(tetrafluoroethylene) particles (0.22 g) (DuPont, Wilmington, Del.) were dispersed in the solution using a high shear mixture for 5 min. The coating was coated on top of the underlayer at a coating weight of 0.5 $g/m^2$ to produce a thermally imageable element.

The thermally imageable element was imagewise exposed on a Creo Trendsetter (a thermal exposure device having a laser diode array emitting at 830 nm) at a power setting of 8.5 W and a drum speed of 116.3 rpm, corresponding to an exposure of 160 $mJ/cm^2$. The imaged element was developed with T-153 developer (Kodak Polychrome Graphics), which removed the exposed regions. To examine the chemical resistance of the image, the imaged element was wiped with an 80:20 wt % diacetone alcohol/water mixture. The image was essentially wiped out.

Comparative Example 2

This example illustrates the solvent resistance of an underlayer of PMP-234. Following the procedure of Comparative Example 1, the one-minute soak loss in the diacetone alcohol/-water mixture was 100%. The one-minute soak loss the 2-butoxyethanol/water mixture was 0%. This suggests that the layer is resistant to fountain solution but not to UV wash.

An imaged element was prepared as described in Comparative Example 1. To examine the chemical resistance of the image, the imaged element was wiped with the diacetone alcohol/water mixture. The image was essentially wiped out.

Comparative Example 3

This example illustrates the solvent resistance of an underlayer of Copolymer 1. Following the procedure of Comparative Example 1, the one-minute soak loss in the diacetone alcohol/water mixture was 0%. The one-minute soak loss in the 2-butoxyethanol/water mixture was 100%. This suggests that the layer is resistant to UV wash but not to fountain solution.

An imaged element was prepared as described in Comparative Example 1. To examine the chemical resistance of the image, the imaged element was wiped with the 2-butoxyethanol/water mixture. The image was essentially wiped out.

Example 1

This example illustrates the solvent resistance of an underlayer comprising a 75:25 by weight mixture of Copolymer 1 and PU copolymer. Following the procedure of Comparative Example 1, 3.75 g of Copolymer 1, 1.25 g of PU copolymer, and 0.9 g of ADS-830A were dissolved in a 100 g of a methanol/-dioxolane/methyl lactate mixture (43:43:14 wt %). The mixture was spin coated onto the lithographic substrate at a coating weight of 1.5 $g/m^2$.

Following the procedure of Comparative Example 1, the one-minute soak loss for the underlayer in the diacetone alcohol/water mixture was 32%. The one-minute soak loss in the 2-butoxyethanol/water mixture was 1%. The chemical resistance parameter was 0.67.

An imaged element was prepared as described in Comparative Example 1, except that imaged element was developed with developer 956 (Kodak Polychrome Graphics). The imaged element was wiped with the diacetone alcohol/water mixture. The image was essentially intact. The imaged element was wiped with the 2-butoxyethanol/water mixture. The image was essentially intact.

Example 2

This example illustrates the solvent resistance of an underlayer comprising a 80:20 by weight mixture of Copolymer 1 and PMP-234. Following the procedure of Comparative Example 1, 4.0 g of Copolymer 1, 1.0 g of PMP-234, and 0.9 g of ADS-830A were dissolved in a 100 g of a methanol/dioxolane/methyl lactate/dimethyl formamide mixture (43:43:7:7 wt %). The mixture was spin coated onto the lithographic substrate at a coating weight of 1.5 $g/m^2$.

Following the procedure of Comparative Example 1, the one-minute soak loss for the underlayer in the diacetone alcohol/water mixture was 32%. The one-minute soak loss in 2-butoxyethanol/water mixture was 1%. The chemical resistance parameter was 0.67.

An imaged element was prepared as described in Example 1. The imaged element was wiped with the diacetone alcohol/water mixture. The image was essentially intact. The imaged element was wiped with the 2-butoxyethanol/water mixture. The image was essentially intact.

Example 3

This example illustrates a thermally imageable element with a top layer that comprises a solubility-suppressing component. P-3000 (4.42 g), HRS02 (0.885 g), SD-140A (8.85 g), ethyl violet (0.017 g), and triazine B (0.13 g) were dissolved in a mixture of toluene (130 g) and 2-methoxypropanol (56 g). The mixture was spin coated at a speed of 80 rpm over the underlayer of the coated substrate produced in Example 1 at a coating weight of 1.6 $g/m^2$ to produce a thermally imageable element.

The thermally imageable element was imagewise exposed on a Creo Trendsetter (a thermal exposure device having a laser diode array emitting at 830 nm) at a power setting of 8.5 W and a drum speed of 120 rpm.

The imaged element was developed by wiping a soft pad soaked with developer 956, a negative developer. Both the top and bottom layers were removed in the thermally exposed regions; the unexposed regions remained intact. The imaged element showed excellent resolution with a dot resolution of 2 to 98% at a screen ruling of 200 line pairs per inch.

An imaged element was also developed with developer PD1 at an 1:8 dilution (a positive developer, Kodak Polychrome Graphics Japan). The imaged element showed excellent resolution.

Examples 4–11

A series of thermally imageable elements was prepared with different top layers. In each case, the polymeric material indicated in Table 1 (1.31 g), P-3000 (0.66 g), ethyl violet (0.005 g), and triazine B (0.0162 g) were dissolved in a mixture of 2-methoxypropanol (67 g), toluene (14.7 g), and 2-butanone (14.7 g).

TABLE 1

| Example | Polymeric Material | Supplier | Description |
|---|---|---|---|
| 4 | 28–2930[a] | | |
| 5 | Amphomer | National Starch | Alkaline soluble polymer |
| 6 | Scriptset 540[a] | | |
| 7 | Carboset 500 | Goodrich | Acrylic polymer |
| 8 | A-21[a] | | |
| 9 | 1077[a] | | |
| 10 | PU Copolymer[a] | | |
| 11 | Epon 3001 | Shell Chemical | Epoxy resin for powder coating |

[a]See glossary

The resulting mixtures were each spin coated at a speed of 80 rpm over the underlayer of the coated substrate produced in Example 1. The resulting thermally imageable elements were each exposed and developed with developer 956 as described in Example 3. Each of the imaged elements produced a good image.

Example 12

This example illustrates an element in which the top layer comprises a solubility-suppressing component. LB 744 (4.85 g) and ethyl violet (0.15 g) were dissolved in a mixture of 20 g of 2-methoxypropanol and 40 g of toluene. The mixture was spin coated at a speed of 80 rpm over the underlayer of the coated substrate produced in Example 1 at a coating weight of 1.2 $g/m^2$ to produce the thermally imageable element. The resulting thermally imageable element was exposed and developed with 956 developer as described in Example 3. A good image was obtained.

Example 13

This example describes the preparation of Copolymer 1. Methyl glycol (1 L) was placed in a round-bottomed flask equipped with a stirrer, thermometer, nitrogen inlet and reflux condenser. Methacrylic acid (55.74 g), N-phenylmaleimide (181.48 g), and methacrylamide (77.13 g) were added and dissolved with stirring. 2,2-Azobisisobutyronitrile (AIBN) (0.425 g) was added and the reaction mixture heated at 60° C. with stirring for about 24 hr. Then about 5 L of methanol was added, and the precipitated copolymer filtered, washed twice with methanol, and dried in the oven at 40° C. for 2 days.

Other polymeric materials of this type may be prepared by following this general procedure. For example, a copolymer of N-phenylmaleimide, methacrylamide, and methacrylic acid (45:35:20 mol %) may be prepared by reaction of methacrylic acid (36.12 g), N-phenylmaleimide (165.4 g), methacrylamide (62.5 g), and AIBN (3.4 g) in methyl glycol (800 mL).

If the polymerization is carried out in 1,3-dioxolane, in some cases reprecipitation can be avoided. The monomers are soluble 1,3-dioxolane, but the polymeric material is insoluble and precipitates during the reaction.

Having described the invention, we now claim the following and their equivalents.

What is claimed is:

1. An imageable element comprising:

a) a substrate, the substrate comprising a hydrophilic surface;

b) an underlayer over the hydrophilic surface; and c) a top layer over the underlayer;

wherein:

the top layer is ink receptive;

exposed regions of the top layer are more readily removable by acrueous alkaline developer than unexposed regions;

the underlayer is soluble or dispersible in aqueous alkaline developer;

the underlayer comprises a combination of at least first polymeric material and a second polymeric material;

the top layer comprises a third polymeric material; and the chemical resistance parameter for the underlayer is greater than about 0.4.

2. The element of claim 1 in which:

the underlayer comprises about 10% to about 90% by weight of the first polymeric material and about 10% to about 90% by weight of the second polymeric material, based on the total weight the first polymeric material and the second polymeric material in the underlayer;

the first polymeric material has a one-minute soak loss of less than 20% in 80 wt % diacetone alcohol/20 wt % water, and the second polymeric material has a one-minute soak loss of less than 20% in 80 wt % 2-butoxyethanol/20 wt % water.

3. The element of claim 2 in which the chemical resistance parameter for the underlayer is greater than about 0.5.

4. The element of claim 3 in which the first polymeric aterial has a one-minute soak loss of less than 10% in 80 wt % diacetone alcohol/20 wt % water, and the second polymeric material has a one-minute soak loss of less than 10% in 80 wt % 2-butoxyethanol/20 wt % water.

5. The element of claim 4 in which the chemical resistance parameter for the underlayer is greater than about 0.6.

6. The element of claim 5 in which the first polymeric material has a one-minute soak loss of less than 5% in 80 wt % diacetone alcohol/20 wt % water, and the second polymeric material has a one-minute soak loss of less than 5% in 80 wt % 2-butoxyethanol/20 wt % water.

7. The element of claim 6 in which the underlayer additionally comprises from about 1 to about 20 wt % of a novolac resin, based on the total amount of the first polymeric material, second polymeric material, and novolac resin in the underlayer.

8. The element of claim 2 in which the third polymeric material comprises phenolic hydroxyl groups and in which the top layer comprises at least one solubility-suppressing component.

9. The element of claim 8 in which the third polymeric material is a novolac resin.

10. The element of claim 9 in which the element absorbs radiation in the range of about 800 nm to 1200 nm.

11. The element of claim 1 in which the top layer comprises a compound that contains an o-diazonaphthoquinone moiety and in which the third polymeric material comprises phenolic hydroxyl groups.

12. The element of claim 1 in which:

the underlayer comprises about 10% to about 90% by weight of the first polymeric material and about 10% to about 90% by weight of the second polymeric material, based on the total weight the first polymeric material and the second polymeric material in the underlayer;

the first polymeric material contains at least one functional group selected from the group consisting of carboxylic acid, N-substituted cyclic imide, and amide; and the second polymeric material contains at least one functional group selected from the group consisting of nitrile and sulfonamide.

13. The element of claim 12 in which:

the first polymeric material has a one-minute soak loss of less than 20% in 80 wt % diacetone alcohol/20 wt % water, and the second polymeric material has a one-minute soak loss of less than 20% in 80 wt % 2-butoxyethanol/20 wt % water.

14. The element of claim 13 in which:

the first polymeric material is a copolymer that comprises an N-substituted maleimide, methacrylamide, and methacrylic acid; and the second polymeric material is either (1) a copolymer that contains a pendent urea group, (2) a copolymer that contains a pendent sulfonamide group, or (3) or a combination thereof.

15. The element of claim 14 in which the first polymeric material comprises about 25 to about 75 mol % of N-phenylmaleimide; about 10 to about 50 mol % of methacrylamide; and about 5 to about 30 mol % of methacrylic acid.

16. The element of claim 15 in which the first polymeric material comprises about 35 to about 60 mol % of N-phenylmaleimide; about 15 to about 40 mol % of methacrylamide; and about 10 to about 30 mol % of methacrylic acid.

17. The element of claim 16 in which the second polymeric material comprises about 20 to 80 wt % of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

18. The element of claim 17 in which R is $CH_3$; X is —$(CH_2CH_2)$—; Y is unsubstituted 1,4-phenylene; and Z is —OH.

19. The element of claim 16 in which the second polymeric material contains about 10 to 90 mol % of a sulfonamide monomer unit; acrylonitrile or methacrylonitrile; and methyl methacrylate or methyl acrylate.

20. The element of claim 1 in which the first polymeric material comprises about 25 to about 75 mol % of N-phenylmaleimide; about 10 to about 50 mol % of methacrylamide; and about 5 to about 30 mol % of methacrylic acid.

21. An imageable element comprising:

a) a substrate, the substrate comprising a hydrophilic surface;

b) an underlayer over the hydrophilic surface; and c) a top layer over the underlayer;

wherein:

the top layer is ink receptive;

exposed regions of the top layer are more readily removable by aqueous alkaline developer than unexposed regions;

the underlayer is soluble or dispersible in aqueous alkaline developer;

the underlayer comprises a combination of at least a first polymeric material and a second polymeric material;

the underlayer comprises about 10% to about 900 by weight of a first polymeric material and about 10% to about 90% by weight of a second polymeric material, based on the total weight of the first polymeric material and the second polymeric material in the underlayer;

the first polymeric material has a one-minute soak loss of less than 20% in 80 wt % diacetone alcohol/20 wti water, and the second polymeric material has a one-minute soak loss of less than 20% in 80 wt % 2-butoxyethanol/20 wt % water.

22. The element of claim 21 in which the one-minute soak loss of the underlayer in one solvent selected from the group consisting of 80 wt % diacetone alcohol/20 wt % water and 20% in 80 wt % 2-butoxyethanol/20 wt % is less than about 60%, and the one-minute soak loss in the other solvent is less than about 40%.

23. The element of claim 22 in which the one-minute soak loss of the underlayer in one of the solvents is less than 40% and the one-minute soak loss in the other of the solvents is less than 20%.

24. The element of claim 23 in which the one-minute soak loss of the underlayer in one of the solvents is less than 35% and the one-minute soak loss in the other of the solvents is less than 10%.

25. The element of claim 24 in which the first polymeric material contains at least one functional group selected from the group consisting of carboxylic acid, N-substituted cyclic imide, and amide; and the second polymeric material contains at least one functional group selected from the group consisting of nitrile and sulfonamide.

26. The element of claim 25 in which:

the first polymeric material is a copolymer that comprises an N-substituted maleimide, methacrylamide, and methacrylic acid; and the second polymeric material is either (1) a copolymer that contains a pendent urea group, (2) a copolymer that contains a pendent sulfonamide group, or (3) a combination thereof.

27. The element of claim 26 in which:

the first polymeric material comprises about 25 to about 75 mol % of N-phenylmaleimide; about 10 to about 50 mol % of methacrylamide; and about 5 to about 30 mol % of methacrylic acid; and the second polymeric material comprises either: (1) about to 80 wt % of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$; or (2) about 10 to 90 mol % of a sulfonamide monomer unit; acrylonitrile or methacrylonitrile; and methyl methacrylate or methyl acrylate.

28. The element of claim 27 in which:

the first polymeric material comprises about 35 to about 60 mol % of N-phenylmaleimide; about 15 to about 40 mol % of methacrylamide; and about 10 to about 30 mol % of methacrylic acid; and either: (1) comprises about 20 to 80 wt % of one of more monomers represented by the general formula:

$$[CH_2{=}C(CH_3){-}CO_2{-}CH_2CH_2{-}NH{-}CO{-}NH{-}p{-}C_6H_4{-}OH],$$

or (2) comprises N-(p-aminosulfonylphenyl) methacrylamide; acrylonitrile; and (3) methyl methacrylate.

29. The element of claim 28 in which the chemical resistance parameter of the underlayer is at least about 0.65.

30. An imageable element comprising:

a) a substrate, the substrate comprising a hydrophilic surface;

b) an underlayer over the hydrophilic surface; and c) a top layer over the underlayer;

wherein:

the top layer is ink receptive;

exposed regions of the top layer are more readily removable by aqueous alkaline developer than unexposed regions;

the underlayer is soluble or dispersible in aqueous alkaline developer;

the underlayer comprises a combination of at least a first polymeric material and a second polymeric material;

the underlayer comprises about 10% to about 90% by weight of a first polymeric material and about 10% to about 90% by weight of a second polymeric material, based on the total weight of the first polymeric material and the second polymeric material in the underlayer;

the first polymeric material comprises about 25 to about 75 mol % of N-phenylmaleimide; about 10 to about 50 mol % of methacrylamide; and about 5 to about 30 mol % of methacrylic acid.

31. The imageable element of claim 30 in which the second polymeric material comprises either: (1) about 20 to 80 wt % of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$; or (2) about 10 to 90 mol % of a sulfonamide monomer unit; acrylonitrile or methacrylonitrile; and methyl methacrylate or methyl acrylate.

32. The imageable element of claim 31 in which:

the first polymeric material comprises about 35 to about 60 mol % of N-phenylmaleimide; about 15 to about 40 mol % of methacrylamide; and about 10 to about 30 mol % of methacrylic acid; and either: (1) comprises about 20 to 80 wt % of one of more monomers represented by the general formula:

$$[CH_2{=}C(CH_3){-}CO_2{-}CH_2CH_2{-}NH{-}CO{-}NH{-}p{-}C_6H_4{-}OH],$$

or (2) comprises N-(p-aminosulfonylphenyl) methacrylamide; acrylonitrile; and (3) methyl methacrylate.

33. A method for forming an image, the method comprising:

(1) imaging an imageable element to form an imaged element, the imageable element comprising:

a) a substrate, the substrate comprising a hydrophilic surface;

b) an underlayer over the hydrophilic surface; and c) a top layer over the underlayer:

wherein:

the top layer is ink receptive;

the underlayer is soluble in aqueous alkaline developer;

the underlayer comprises a combination of at least a first polymeric material and a second polymeric material;

the top layer comprises a third polymeric material; and the chemical resistance parameter for the underlayer is greater than about 0.4: and (2) developing the imaged element with an aqueous alkaline developer to form an imaged and developed element, the imaged and developed element comprising an image.

34. The method of claim 33 in which the chemical resistance parameter for the underlayer is greater than about 0.6.

35. The method of claim 34 additionally comprising, after step (2):

(3) baking the imaged and developed element.

36. The method of claim 35 in which the underlayer additionally comprises from about 1 to about 20 wt % of a novolac resin, based on the total amount of the first polymeric material, second polymeric material, and novolac resin in the underlayer.

37. The method of claim 34 in which the underlayer comprises about 10% to about 90% by weight of the first polymeric material and about 10% to about 90% by weight of the second polymeric material, based on the total weight the first polymeric material and the second polymeric material in the underlayer;

the first polymeric material contains at least one functional group selected from the group consisting of carboxylic acid, N-substituted cyclic imide, and amide; and the second polymeric material contains at least one functional group selected from the group consisting of nitrile and sulfonamide.

38. The method of claim 37 in which:

the first polymeric material comprises about 25 to about 75 mol % of N-phenylmaleimide; about 10 to about 50 mol % of methacrylamide; and about 5 to about 30 mol % of methacrylic acid; and the second polymeric material comprises either: (1) about 20 to 80 wt % of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$; or (2) about 10 to 90 mol % of a sulfonamide monomer unit; acrylonitrile or methacrylonitrile; and methyl methacrylate or methyl acrylate.

39. The method of claim 38 in which:

the first polymeric material comprises about 35 to about 60 mol % of N-phenylmaleimide; about 15 to about 40 mol % of methacrylamide; and about 10 to about 30 mol % of methacrylic acid; and either: (1) comprises about 20 to 80 wt % of one of more monomers represented by the general formula:

ti $[CH_2{=}C(CH_3){-}CO_2{-}CH_2CH_2{-}NH{-}CO{-}NH{-}p{-}C_6H_4{-}OH]$, or (2) comprises N-(p-aminosulfonylphenyl) methacrylamide; 10 acrylonitrile; and (3) methyl methacrylate.

40. The method of claim 34 in which imaging is carried out by exposing the element with ultraviolet or visible radiation.

41. The method of claim 34 in which the element absorbs radiation in the range of about 800 nm to about 1200 nm and imaging is carried out by exposing the element with radiation in the range of about 800 nm to about 1200 nm.

42. The method of claim 34 in which the imaging is carried with a thermal head.

43. A composition comprising at least 50 wt % of a combination comprising about 10% to about 90% by weight of a first polymeric material and about 10% to about 90% by weight of a second polymeric material, based on the total weight the first polymeric material and the second polymeric material in the composition:

in which:

the first polymeric material comprises about 25 to about 75 mol % of N-phenylmaleimide; about 10 to about 50 mol % of methacrylamide; and about 5 to about 30 mol % of methacrylic acid; and the second polymeric material comprises either: (1) about 20 to 80 wt % of one of more monomers represented by the general formula:

$$[CH_2{=}C(R){—}CO_2{—}X{—}NH{—}CO{—}NH{—}Y{—}Z],$$

in which R is —H or —$CH_3$; X is a bivalent linking group; Y is a substituted or unsubstituted bivalent aromatic group; and Z is —OH, —COOH, or —$SO_2NH_2$; or (2) about 10 to 90 mol % of a sulfonamide monomer unit; acrylonitrile or methacrylonitrile; and methyl methacrylate or methyl acrylate.

44. The composition of claim 43 in which the first polymeric material comprises about 35 to about 60 mol % of N-phenylmaleimide; about 15 to about 40 mol % of methacrylamide; and about 10 to about 30 mol % of methacrylic acid.

45. The composition of claim 44 in which either: (1) comprises about 20 to 80 wt % of one of more monomers represented by the general formula:

$$[CH_2{=}C(CH_3){—}CO_2{—}CH_2CH_2{—}NH{—}CO{—}NH{—}p{—}C_6H_4{—}OH],$$

or (2) comprises N-(p-aminosulfonylphenyl) methacrylamide; acrylonitrile; and (3) methyl methacrylate.

46. The composition of claim 45 in which the composition additionally comprises from about 1 to about 20 wt % of a novolac resin.

47. The composition of claim 45 in which the composition additionally comprises about 1 wt % to about 30 wt % of an absorber that absorbs radiation in the range of about 800 nm to 1200 nm.

48. The composition of claim 47 in which the composition dditionally comprises from about 1 to about 20 wt % of a ovolac resin.

49. The composition of claim 45 in which the combination comprises at least about 60 wt % of the combination.

50. The composition of claim 45 in which the combination comprises at least about 65 wt % of the combination.

51. An imaged and developed element useful as a lithographic printing member, the element prepared by a method comprising:

(1) imaging an imageable element to form an imaged element comprising imaged and unimaged regions, the imageable element comprising:
   a) a substrate, the substrate comprising a hydrophilic surface;
   b) an underlayer over the hydrophilic surface; and
   c) a top layer over the underlayer;
   wherein:
      the top layer is ink receptive;
      exposed regions of the top layer are more readily removable bv aqueous alkaline developer than unexposed regions;
      the underlayer is soluble or dispersible in aqueous alkaline developer;
      the underlayer comprises a combination of at least a first polymeric material and a second polymeric material;
      the top layer comprises a third polymeric material; and
      the chemical resistance parameter for the underlayer is greater than about 0.4; and (2) developing the imaged element with an aqueous alkaline developer and removing the exposed regions to form the imaged and developed element, the imaged and developed element comprising an image.

52. The imaged and developed element of claim 51 in hich at least 50 wt % of a combination comprising about 10% to about 90% by weight of a first polymeric material and about 10% to about 90% by weight of a second polymeric material, based on the total weight the first polymeric material and the second polymeric material in the composition:

in which:

the first polymeric material comprises about 25 to about 75 mol % of N-phenylmaleimide; about 10 to about 50 mol % of methacrylamide; and about 5 to about 30 mol % of methacrylic acid; and the second polymeric material comprises either: (1) about 20 to 80 wt % of one of more monomers represented by the general formula:

$$[CH_2{=}C(R){—}CO_2{—}X{—}NH{—}CO{—}NH{—}Y{—}Z],$$

in which R is —H or —$CH_3$; X is a bivalent linking group; Y is a substituted or unsubstituted bivalent aromatic group; and Z is —OH, —COOH, or —$SO_2NH_2$; or (2) about 10 to 90 mol % of a sulfonamide monomer unit; acrylonitrile or methacrylonitrile; and methyl methacrylate or methyl acrylate.

* * * * *

UNITED STATES PATENT AND TRADEMARK OFFICE

CERTIFICATE OF CORRECTION

PATENT NO. : 6,294,311 B1
DATED : September 25, 2001
INVENTOR(S) : Shimazu et al.

It is certified that error appears in the above-identified patent and that said Letters Patent is hereby corrected as shown below:

Column 7,
Line 13, after the word weight, insert -- of --
Line 17, after the word weight, insert -- of --

Column 8,
Line 48, after the word act, insert -- as --

Column 11,
Line 35, delete "know" and insert therefor -- known --

Column 12,
Line 53, delete "to"
Line 60, after the word may, insert -- absorb --

Column 20,
Line 4, delete "acrueous" and insert therefor -- aqueous --
Line 16, after the word weight, insert -- of --
Line 62, after the word weight, insert -- of --

Column 21,
Line 30, delete the second occurrence of "of" and insert therefor -- or --
Line 66, delete "900" and insert therefor -- 90% --

Column 22,
Line 6, delete "wti" and insert therefor -- wt% --
Line 42, after the word about, insert -- 20 --
Line 43, delete the second occurrence of "of" and insert therefor -- or --

Column 23,
Lines 29 and 45, delete the second occurrence of "of" and insert therefor -- or --

Column 24,
Lines 39 and 55, delete the second occurrence of "of" and insert therefor -- or --
Line 61, delete "10"

UNITED STATES PATENT AND TRADEMARK OFFICE

CERTIFICATE OF CORRECTION

PATENT NO. : 6,294,311 B1
DATED : September 25, 2001
INVENTOR(S) : Shimazu et al.

It is certified that error appears in the above-identified patent and that said Letters Patent is hereby corrected as shown below:

Column 25,
Line 4, after the word carried, insert -- out --
Line 9, after the word weight, insert -- of --
Lines 17 and 34, delete the second occurrence of "of" and insert therefor -- or --
Line 51, delete "dditionally" and insert therefor -- additionally --
Line 52, delete "ovolac" and insert therefor -- novolac --

Column 26,
Line 30, delete "hich" and insert therefor -- which --
Line 34, after the word weight, insert -- of --
Line 44, delete the second occurrence of "of" and insert therefor -- or --

Signed and Sealed this

Thirtieth Day of April, 2002

Attest:

JAMES E. ROGAN
*Director of the United States Patent and Trademark Office*

*Attesting Officer*